US008330516B2

(12) United States Patent
Tseng

(10) Patent No.: US 8,330,516 B2
(45) Date of Patent: Dec. 11, 2012

(54) BANDGAP CIRCUIT AND START CIRCUIT THEREOF

(75) Inventor: Wei-Kai Tseng, Tainan (TW)

(73) Assignee: Himax Technologies Limited, Tainan (TW)

( * ) Notice: Subject to any disclaimer, the term of this patent is extended or adjusted under 35 U.S.C. 154(b) by 28 days.

(21) Appl. No.: 13/045,177

(22) Filed: Mar. 10, 2011

(65) Prior Publication Data

US 2012/0229199 A1 Sep. 13, 2012

(51) Int. Cl.
*H03K 17/22* (2006.01)
*H03K 17/06* (2006.01)
*G05F 3/24* (2006.01)
*G05F 3/26* (2006.01)

(52) U.S. Cl. ........ 327/198; 327/539; 323/901; 323/314; 323/315

(58) Field of Classification Search ........................ None
See application file for complete search history.

(56) References Cited

U.S. PATENT DOCUMENTS 5,684,394 A * 11/1997 Marshall ........................ 323/315
6,002,243 A * 12/1999 Marshall ........................ 323/313
6,157,245 A * 12/2000 Rincon-Mora ............... 327/539
6,677,808 B1 * 1/2004 Sean et al. .................... 327/539

* cited by examiner

*Primary Examiner* — Lincoln Donovan
*Assistant Examiner* — Terry L Englund
(74) *Attorney, Agent, or Firm* — J.C. Patents

(57) ABSTRACT

A start circuit adapted to start a reference circuit including a plurality of bias nodes is provided. The start circuit includes a current source, a current mirror, a load device, and a control device. The current source determines whether or not to generate an internal current according to a plurality of bias voltages on a part of the bias nodes. The current mirror duplicates the internal current to produce a mirrored current. The load device adjusts a control voltage according to the mirrored current. The control device determines whether or not to generate a start voltage according to the control voltage, and transmits the start voltage to one of the part of the bias nodes, so as to break the reference circuit away from a zero-current state.

10 Claims, 3 Drawing Sheets

BANDGAP CIRCUIT AND START CIRCUIT THEREOF

BACKGROUND

1. Field of the Invention

The invention relates to a bandgap circuit and start circuit thereof. Particularly, the invention relates to a bandgap circuit and start circuit thereof with start function.

2. Description of Related Art

FIG. 1 is a circuit diagram of a conventional bandgap circuit. As shown in FIG. 1, the bandgap circuit 100 includes a start circuit 110 and a reference current generating circuit 120. The reference current generating circuit 120 includes a plurality of current mirrors 121-124, and the current mirrors 121-124 are connected in cascade with each other and have bias nodes $N_{11}$-$N_{14}$. Moreover, the cascade current mirrors 121-124 are electrically connected to ground through bipolar transistors BT11 and BT12 and a resistor R1. In this way, the reference current generating circuit 120 can map a bias current $IB_1$ proportional to absolute temperature (PTAT) through P-channel transistors MT11 and MT12.

To guarantee the reference current generating circuit 120 to normally provide the bias current $IB_1$, the start circuit 110 is used to break the reference current generating circuit 120 away from a zero-current state. During an operation, one of bias voltages $VB_{11}$ and $VB_{12}$ on the bias nodes $N_{13}$ and $N_{14}$ is transmitted to the start circuit 110, and the start circuit 110 determines whether or not to provide a start voltage $VT_1$ to the bias node $N_{11}$ or $N_{12}$ according to a conducting state of an N-channel transistor MN 12. For example, FIG. 2 is a timing diagram of a power voltage. Referring to FIG. 2, according to a power on sequence, the start circuit 110 respectively starts the reference current generating circuit 120 during time intervals $T_{21}$ and $T_{22}$.

During the time interval $T_{21}$, a power voltage $VD_1$ is gradually increased from the lowest level (for example, 0 volt) to a level $LV_{21}$. Moreover, during an initial increasing stage of the power voltage $VD_1$, the bias voltages $VB_{11}$ and $VB_{12}$ approach to the lowest level, so that an N-channel transistor MN11 cannot be turned on. Meanwhile, a gate voltage of the N-channel transistor MN12 is pulled up to a high voltage level, so that the N-channel transistor MN12 is turned on. In this way, the start circuit 110 can output the start voltage $VT_1$, so as to break the reference current generating circuit 120 away from the zero-current state. Thereafter, the bias voltages $VB_{11}$ and $VB_{12}$ are increased as the power voltage $VD_1$ increases, so that the N-channel transistor MN11 is turned on. Now, the gate voltage of the N-channel transistor MN12 is pulled down to the low voltage level, so that the N-channel transistor MN12 cannot be turned on. In this way, the start circuit 110 stops outputting the start voltage $VT_1$, and the reference current generating circuit 120 can normally supply the bias current $IB_1$.

However, when the start circuit 110 performs the start operation for a second time, i.e. during the time interval $T_{22}$, the power voltage $VD_1$ is gradually increased from a level $LV_{22}$ to the level $LV_{21}$. Now, since the power voltage $VD_1$ is not completely pulled down to the lowest level (for example, 0 volt), the bias voltages $VB_{11}$ and $VB_{12}$ cannot be completely discharged. Therefore, during the initial increasing stage of the power voltage $VD_1$, the transistor MN1 is kept in the turn-on station, so that the transistor MN12 cannot be turned on, and the current mirrors 121-124 cannot produce an initial current. Therefore, the reference current generating circuit 120 cannot be broken away from the zero-current state.

In other words, when the power voltage is not completely pulled down to the lowest level, or when the power voltage is turned off and is quickly turned on again, since the bias voltages on the bias nodes are not completely discharged, the conventional start circuit 110 may miss-judge a time point of the starting operation. In other words, the conventional start circuit 110 has a chance to fail starting the reference current generating circuit 120 in some power on sequence.

SUMMARY OF THE INVENTION

The invention is directed to a start circuit, which can sense a current in a reference circuit to serve as a basis for starting. In this way, even if bias voltages on bias nodes are not completely discharged, the start circuit can still normally start the reference circuit.

The invention is directed to a bandgap circuit, which starts a reference circuit by employing a start circuit. Furthermore, even if bias voltages on bias nodes are not completely discharged, the start circuit can still normally start the reference circuit.

The invention provides a start circuit adapted to start a reference circuit including a plurality of bias nodes. The start circuit includes a current source, a current mirror, a load device, and a control device. The current source determines whether or not to generate an internal current according to a plurality of bias voltages on a part of the bias nodes. The current mirror duplicates the internal current to produce a mirrored current. The load device adjusts a control voltage according to the mirrored current. The control device determines whether or not to generate a start voltage according to the control voltage, and transmits the start voltage to one of the part of the bias nodes, so as to break the reference circuit away from a zero-current state.

In an embodiment of the invention, the current source includes a plurality of first P-channel transistors. Gates of the first P-channel transistors are electrically connected to the part of the bias nodes, and the first P-channel transistors are connected in series between a power voltage and the current mirror.

In an embodiment of the invention, the current mirror includes a first N-channel transistor and a second N-channel transistor. A drain and a gate of the first N-channel transistor are electrically connected to the current source, and a source of the first N-channel transistor is electrically connected to a ground voltage. A drain of the second N-channel transistor is electrically connected to the load device, a gate of the second N-channel transistor is electrically connected to the gate of the first N-channel transistor, and a source of the second N-channel transistor is electrically connected to the ground voltage.

In an embodiment of the invention, the load device includes a plurality of second P-channel transistors. Gates of the second P-channel transistors are electrically connected to the ground voltage, and the second P-channel transistors are connected in series between the power voltage and the drain of the second N-channel transistor.

In an embodiment of the invention, the control device includes a third N-channel transistor. A drain of the third N-channel transistor is electrically connected to one of the part of the bias nodes, a gate of the third N-channel transistor is electrically connected to the drain of the second N-channel transistor, and a source of the third N-channel transistor is electrically connected to the ground voltage.

The invention provides a bandgap circuit, including a reference circuit and a start circuit. The reference circuit includes a plurality of bias nodes. The start circuit includes a current source, a current mirror, a load device, and a control device. The current source determines whether or not to generate an internal current according to a plurality of bias voltages on a part of the bias nodes. The current mirror duplicates the internal current to produce a mirrored current. The load device adjusts a control voltage according to the mirrored current. The control device determines whether or not to generate a start voltage according to the control voltage, and transmits the start voltage to one of the part of the bias nodes, so as to break the reference circuit away from a zero-current state.

According to the above descriptions, in the invention, the current source is used to sense the current in the reference circuit, and whether the reference circuit is started is determined by whether the internal current is generated. In this way, even if the bias voltages on the bias nodes are not completely discharged during a start period, the start circuit of the invention can still normally start the reference circuit, and break the reference circuit away from the zero-current state.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 3:
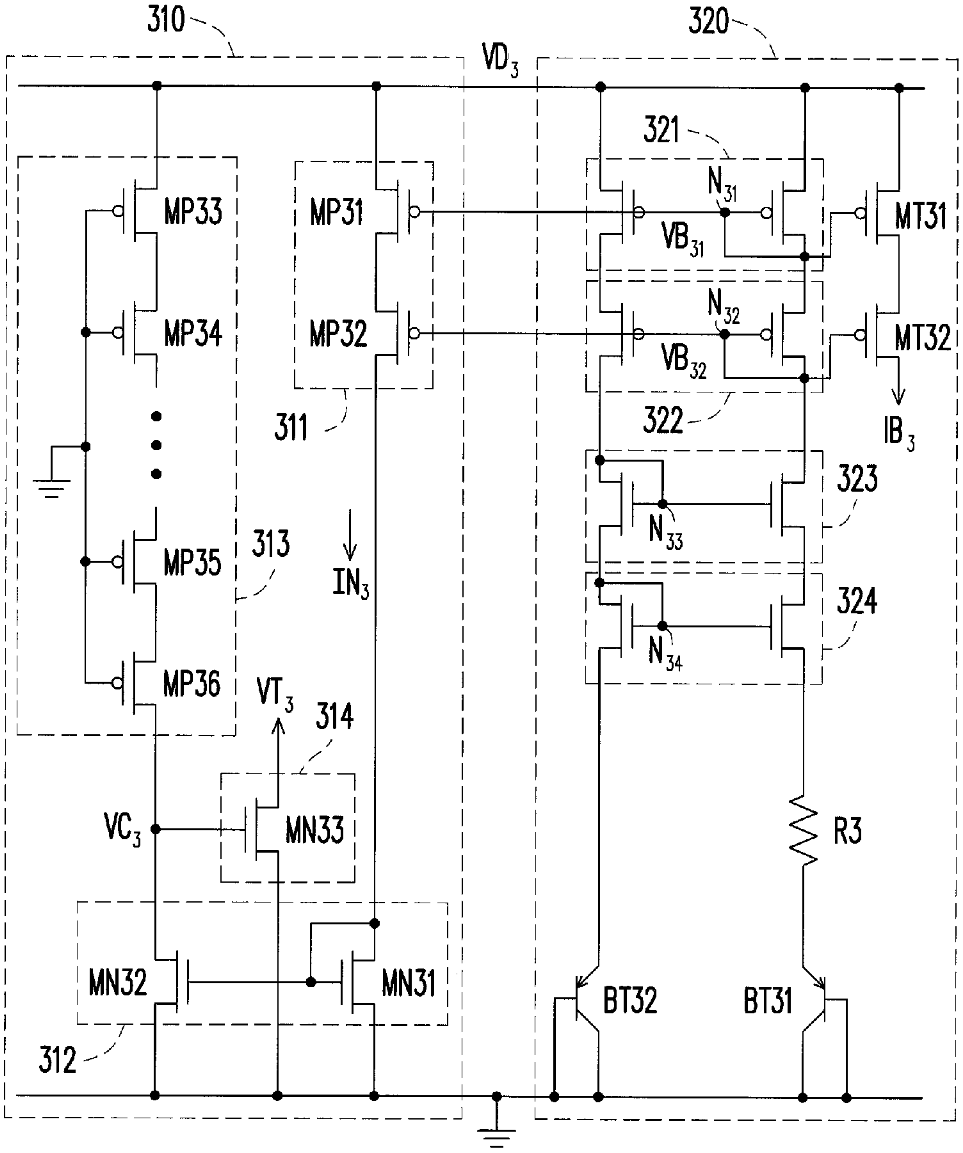
FIG. 3 is a circuit diagram of a bandgap circuit according to an embodiment of the invention.

FIG. 3 is a circuit diagram of a bandgap circuit according to an embodiment of the invention. As shown in FIG. 3, the bandgap circuit includes a start circuit 310 and a reference circuit 320. The reference circuit 320 is, for example, a reference current generating circuit or a reference voltage generating circuit. In the present embodiment, the reference current generating circuit is taken as an example for description, so that the reference circuit 320 includes current mirrors 321-324, a resistor R3, bipolar transistors BT31 and BT32, and P-channel transistors MT31 and MT32.

The current mirrors 321-324 are connected in cascade with each other and have bias nodes $N_{31}$-$N_{34}$. Moreover, the current mirror 321 is used for receiving a power voltage $VD_3$. One end of the current mirror 324 is electrically connected to a ground voltage through the resistor R3 and the bipolar transistor BT31, and another end of the current mirror 324 is electrically connected to the ground voltage through the bipolar transistor BT32. In this way, the reference current generating circuit 320 can map a bias current $IB_3$ proportional to absolute temperature (PTAT) through the P-channel transistors MT31 and MT32.

Referring to FIG. 3, the start circuit 310 includes a current source 311, a current mirror 312, a load device 313 and a control device 314. The current source 311 includes P-channel transistors MP31 and MP32. Here, the P-channel transistors MP31 and MP32 are connected in series between the power voltage $VD_3$ and the current mirror 312. In view of a detailed structure, a source of the P-channel transistor MP31 is electrically connected to the power voltage $VD_3$, and a gate of the P-channel transistor MP31 is electrically connected to the bias node $N_{31}$. Moreover, a source of the P-channel transistor MP32 is electrically connected to a drain of the P-channel transistor MP31, a gate of the P-channel transistor MP32 is electrically connected to the bias node $N_{32}$, and a drain of the P-channel transistor MP32 is electrically connected to the current mirror 312.

The current mirror 312 includes N-channel transistors MN31 and MN32, where a drain and a gate of the N-channel transistor MN31 are electrically connected to the current source 311, and a source of the N-channel transistor MN31 is electrically connected to the ground voltage. Moreover, a drain of the N-channel transistor MN32 is electrically connected to the load device 313, a gate of the N-channel transistor MN32 is electrically connected to the gate of the N-channel transistor MN31, and a source of the N-channel transistor MN 32 is electrically connected to the ground voltage.

The load device 313 includes a plurality of P-channel transistors MP33-MP36. Gates of the P-channel transistors MP33-MP36 are electrically connected to the ground voltage, and the P-channel transistors MP33-MP36 are connected in series between the power voltage $VD_3$ and the drain of the N-channel transistor MN32. Moreover, the control device 314 includes an N-channel transistor MN33. A drain of the N-channel transistor MN33 is electrically connected to one of the bias nodes $N_{31}$ and $N_{32}$, a gate of the N-channel transistor MN33 is electrically connected to the drain of the N-channel transistor MN32, and a source of the N-channel transistor MN33 is electrically connected to the ground voltage. Furthermore, the load device could be composed of one or many resistors electrically connected in series.

Figure 1:
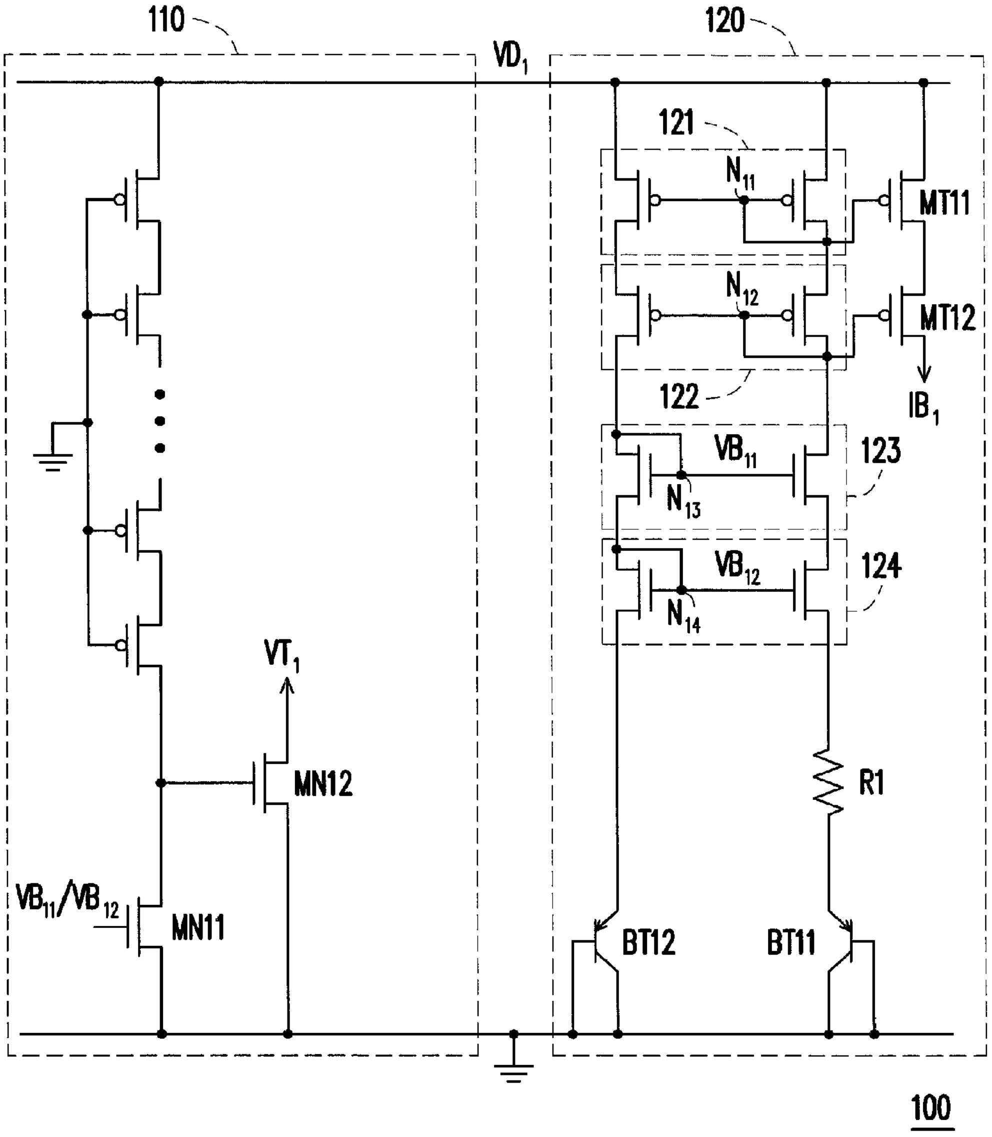
FIG. 1 (RELATED ART)
FIG. 1 is a circuit diagram of a conventional bandgap circuit.
Figure 2:
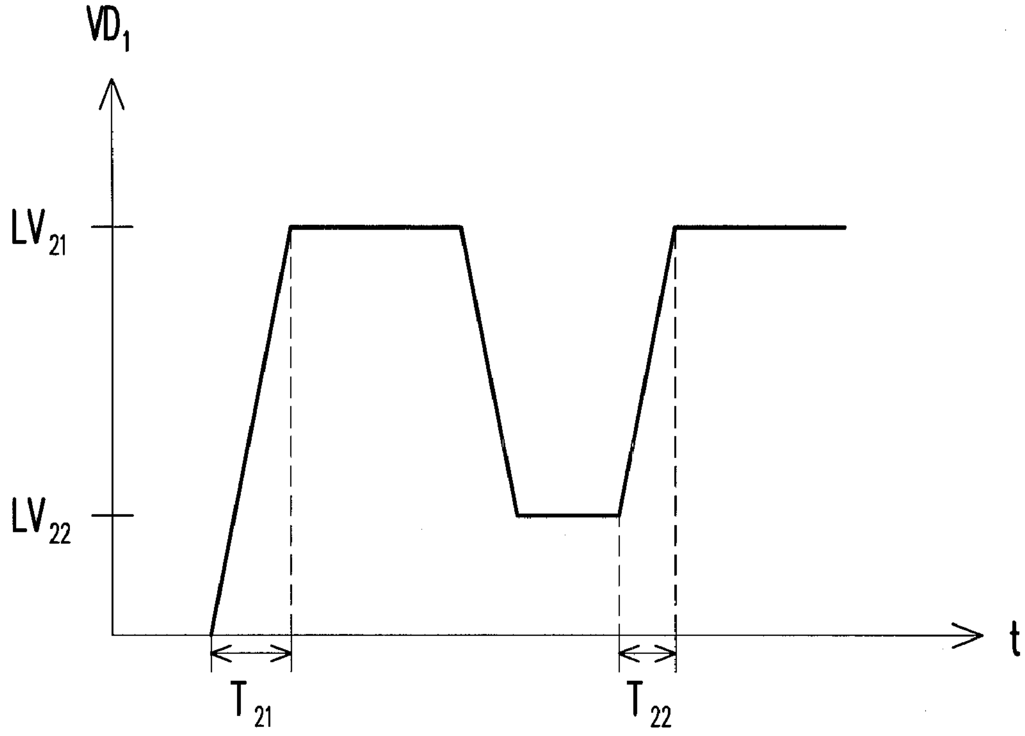
FIG. 2 (RELATED ART)
FIG. 2 is a timing diagram of a power voltage.

In an actual operation, according to a power on sequence of FIG. 2, the start circuit 310 respectively starts the reference circuit 320 during the time intervals $T_{21}$ and $T_{22}$. During the time interval $T_{21}$, the power voltage $VD_3$ is gradually increased from the lowest level (for example, 0 volt) to the level $LV_{21}$. Moreover, during an initial increasing stage of the power voltage $VD_3$, the current mirrors 321-324 of the reference circuit 320 cannot generate a current. Comparatively, bias voltages $VB_{31}$ and $VB_{32}$ at the bias nodes $N_{31}$ and N32 cannot make the current source 311 to generate an internal current $IN_3$.

Therefore, the current mirror 312 cannot provide a mirrored current to the load device 313. In case that the mirrored current is not received, the load device 313 pulls up a level of a control voltage $VC_3$ to a high voltage level. In this way, the control device 314 is conducted according to the control voltage $VC_3$ with high voltage level, so as to produce a start voltage $VT_3$ to one of the bias nodes $N_{31}$ and $N_{32}$. When the start voltage $VT_3$ is received, the current mirrors 321-324 of the reference circuit 320 generate an initial current, so as to break the reference circuit 320 away from the zero-current state.

Thereafter, as the power voltage $VD_3$ gradually increases, the current source 311 generates the internal current $IN_3$ according to the bias voltages $VB_{31}$ and $VB_{32}$. Comparatively, the current mirror 312 duplicates the internal current $IN_3$, and generates the mirrored current to the load device 313. When the mirrored current is received, the load device 313 pulls down the level of the control voltage $VC_3$ to a low voltage level. Therefore, the control device 314 is not conducted according to the control voltage $VC_3$ with the low voltage level, and cannot produce the start voltage $VT_3$ to one of the bias nodes $N_{31}$ and $N_{32}$. In this way, the start circuit 310 stops outputting the start voltage $VT_3$, and the reference circuit 320 can normally supply the bias current $IB_3$.

Further, when the start circuit 110 performs the start operation for a second time, i.e. during the time interval $T_{22}$, the power voltage $VD_3$ is gradually increased from the level $LV_{22}$ to the level $LV_{21}$. Now, although the power voltage $VD_3$ is not completely pulled down to the lowest level (for example, 0 volt), the current mirrors 321-324 of the reference circuit 320 still cannot generate a current during an initial increasing stage of the power voltage $VD_3$. Therefore, the same to the first start operation, the bias voltages $VB_{31}$ and $VB_{32}$ at the bias nodes $N_{31}$ and $N_{32}$ still cannot make the current source 311 to generate the internal current $IN_3$. In this way, the start circuit 310 can provide the start voltage $VT_3$ to one of the bias nodes $N_{31}$ and $N_{32}$. Therefore, the current mirrors 321-324 in the reference circuit 320 generate the initial current, so as to break the reference circuit 320 away from the zero-current state.

Similarly, during the second start period, as the power voltage $VD_3$ gradually increases, the current source 311 generates the internal current $IN_3$ according to the bias voltages $VB_{31}$ and $VB_{32}$. Comparatively, the current mirror 312 generates the mirrored current to the load device 313, so as to pull down the level of the control voltage $VC_3$ to the low voltage level. Therefore, the control device 314 stops outputting the start voltage $VT_3$ to the reference circuit 320 according to the control voltage $VC_3$ with the low voltage level.

In summary, in the invention, the current source is used to sense the current in the reference circuit, and whether the reference circuit is started is determined by whether the internal current is generated. In this way, when the power voltage is not completely pulled down to the lowest level, or the power voltage is turned off and is quickly turned on again, the start circuit of the invention can still determine the time point of the start operation. In other words, even if the bias voltages on the bias nodes are not completely discharged during the start period, the start circuit of the invention can still normally start the reference circuit, and break the reference circuit away from the zero-current state.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A start circuit, adapted to start a reference circuit, and the start circuit comprising:
- a current source, electrically connected to a plurality of bias nodes within the reference circuit, and for determining whether or not to generate an internal current according to a plurality of bias voltages on the plurality of bias nodes;
- a current mirror, for duplicating the internal current to produce a mirrored current;
- a load device, for adjusting a control voltage according to the mirrored current; and
- a control device, for determining whether or not to generate a start voltage according to the control voltage, and transmitting the start voltage to one of the plurality of bias nodes, so as to break the reference circuit away from a zero-current state, wherein the control device comprises:
- a first N-channel transistor, having a drain electrically connected to the one of the plurality of bias nodes, a gate electrically connected to the current mirror and the load device, and a source electrically connected to a ground voltage.

2. The start circuit as claimed in claim 1, wherein the current source comprises:
- a plurality of P-channel transistors, wherein gates of the P-channel transistors are electrically connected to the plurality of bias nodes, and the P-channel transistors are connected in series between a power voltage and the current mirror.

3. The start circuit as claimed in claim 1, wherein the current mirror comprises:
- a second N-channel transistor, having a drain and a gate electrically connected to the current source, and a source electrically connected to the ground voltage; and
- a third N-channel transistor, having a drain electrically connected to the load device, a gate electrically connected to the gate of the second N-channel transistor, and a source electrically connected to the ground voltage.

4. The start circuit as claimed in claim 3, wherein the load device comprises:
- a plurality of P-channel transistors, wherein gates of the P-channel transistors are electrically connected to the ground voltage, and the P-channel transistors are connected in series between a power voltage and the drain of the third N-channel transistor.

5. The start circuit as claimed in claim 1, wherein the reference circuit is a reference current generating circuit or a reference voltage generating circuit.

6. A bandgap circuit, comprising:
- a reference circuit; and
- a start circuit, for starting the reference circuit and comprising:
- a current source, electrically connected to a plurality of bias nodes within the reference circuit, and for determining whether or not to generate an internal current according to a plurality of bias voltages on the plurality of bias nodes;
- a current mirror, for duplicating the internal current to produce a mirrored current;
- a load device, for adjusting a control voltage according to the mirrored current; and
- a control device, for determining whether or not to generate a start voltage according to the control voltage, and transmitting the start voltage to one of the plurality of bias nodes, so as to break the reference circuit away from a zero-current state, wherein the control device comprises:
- a first N-channel transistor, having a drain electrically connected to the one of the plurality of bias nodes, a gate electrically connected to the current mirror and the load device, and a source electrically connected to a ground voltage.

7. The bandgap circuit as claimed in claim 6, wherein the current source comprises:
- a plurality of P-channel transistors, wherein gates of the P-channel transistors are electrically connected to the plurality of bias nodes, and the P-channel transistors are connected in series between a power voltage and the current mirror.

8. The bandgap circuit as claimed in claim 6, wherein the current mirror comprises:
- a second N-channel transistor, having a drain and a gate electrically connected to the current source, and a source electrically connected to the ground voltage; and
- a third N-channel transistor, having a drain electrically connected to the load device, a gate electrically connected to the gate of the second N-channel transistor, and a source electrically connected to the ground voltage.

9. The bandgap circuit as claimed in claim 8, wherein the load device comprises:

a plurality of P-channel transistors, wherein gates of the P-channel transistors are electrically connected to the ground voltage, and the P-channel transistors are connected in series between a power voltage and the drain of the third N-channel transistor.

10. The bandgap circuit as claimed in claim 6, wherein the reference circuit is a reference current generating circuit or a reference voltage generating circuit.

* * * * *